(12) United States Patent
Simkins et al.

(10) Patent No.: US 7,274,211 B1
(45) Date of Patent: Sep. 25, 2007

(54) STRUCTURES AND METHODS FOR IMPLEMENTING TERNARY ADDERS/SUBTRACTORS IN PROGRAMMABLE LOGIC DEVICES

(75) Inventors: James M. Simkins, Park City, UT (US); Brian D. Philofsky, Longmont, CO (US)

(73) Assignee: Xilinx, Inc., San Jose, CA (US)

( * ) Notice: Subject to any disclaimer, the term of this patent is extended or adjusted under 35 U.S.C. 154(b) by 60 days.

(21) Appl. No.: 11/373,700

(22) Filed: Mar. 10, 2006

(51) Int. Cl.
*G06F 7/38* (2006.01)
*H03K 19/173* (2006.01)

(52) U.S. Cl. .............................. 326/38; 326/39; 326/40
(58) Field of Classification Search ............. 326/38–41
See application file for complete search history.

(56) References Cited

U.S. PATENT DOCUMENTS

| | | | |
|---|---|---|---|
| 7,167,022 B1 * | 1/2007 | Schleicher et al. ........... | 326/41 |
| 2003/0028846 A1 * | 2/2003 | Garrett ....................... | 714/796 |

OTHER PUBLICATIONS

Xilinx, Inc.; "XtremeDSP for Virtex-4 FPGAs User Guide"; UG073 (v2.1) Dec. 19, 2005; available from Xilinx, Inc. at http://direct.xilinx.com/bvdocs/userguides/ug073.pdf; pp. 1-130.

* cited by examiner

*Primary Examiner*—Anh Q. Tran
(74) *Attorney, Agent, or Firm*—Lois D. Cartier (57) ABSTRACT

Structures and methods of implementing an adder circuit in a programmable logic device (PLD). The PLD includes dual-output lookup tables (LUTs) and additional programmable logic elements. The adder circuit includes a 3:2 (3 to 2) compressor circuit that maps three input busses into two compressed busses, and a 2-input cascade adder circuit that adds the two compressed busses to yield the final sum bus. The dual-output LUTs implement both the 3:2 compressor circuit and a portion of the 2-input adder. The remaining portion of the 2-input adder is implemented using the additional programmable logic elements of the PLD. In some embodiments, the 3:2 compressor circuit is preceded by an M:3 compressor, which changes the 3-input adder into an M-input adder. In these embodiments, a second input bus is left-shifted with respect to the first input bus, and a third input busses is left-shifted with respect to the second input bus.

20 Claims, 11 Drawing Sheets

STRUCTURES AND METHODS FOR IMPLEMENTING TERNARY ADDERS/SUBTRACTORS IN PROGRAMMABLE LOGIC DEVICES

FIELD OF THE INVENTION

The invention relates to adder/subtractor circuits. More particularly, the invention relates to structures and methods for implementing adders and/or subtractors in a programmable logic device including dual-output lookup tables.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Some other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

One type of function frequently implemented in a PLD is a Digital Signal Processing (DSP) function. DSP functions can include, for example, adders, subtractors, multipliers, and so forth. DSP circuits are commonly implemented using dedicated DSP logic blocks, hard-coded blocks included in a PLD for the specific purpose of efficiently implementing DSP functions. However, a hard-coded DSP function block necessarily has a predetermined width, e.g., 48 bits. When a 16-bit adder, for example, is implemented in a 48-bit DSP block, 32 bits of the DSP block are unused and go to waste. Also, some designs are DSP-intensive, and there may be some DSP functions that cannot be implemented in the DSP blocks simply because all available DSP blocks are already used to implement other DSP functions. Therefore, there are designs and/or design portions in which DSP functions can or must be implemented using the PLD fabric, e.g., in the CLB array.

In many PLD architectures, just a few DSP functions can consume a large amount of the available programmable logic resources. Clearly, the more efficiently these programmable logic resources are used, the more logic can be placed into the PLD. Alternatively, reducing the logic requirements of the DSP function or functions can allow a design to be implemented in a smaller and less expensive PLD. Therefore, it is clearly advantageous to provide efficient implementations of DSP functions such as adders and subtractors in the programmable fabric of a PLD.

SUMMARY OF THE INVENTION

The invention provides structures and methods of implementing an adder circuit (e.g., an adder, subtractor, or adder/subtractor) in a programmable logic device (PLD). The PLD includes dual-output lookup tables (LUTs) and additional programmable logic elements. The adder circuit includes a 3:2 (3 to 2) compressor circuit that maps three input busses into two compressed busses, and a 2-input cascade adder circuit that adds the two compressed busses to yield the final sum bus. The dual-output LUTs implement both the 3:2 compressor circuit and a portion of the 2-input adder. The remaining portion of the 2-input adder is implemented using the additional programmable logic elements of the PLD. This implementation is logically efficient compared to known implementations using standard single-output LUTs, because the input signals to the dual-output LUTs are shared by the functions implemented in the LUTs.

In some embodiments, the 3:2 compressor circuit is preceded by an M:3 compressor (e.g., a 5:3 compressor, a 6:3 compressor, or multiple levels of these compressors), which changes the 3-input adder into an M-input adder. In these embodiments, a second one of the three input busses is left-shifted with respect to the first input bus, and a third one of the three input busses is left-shifted with respect to the second input bus, before they are provided to the 3:2 compressor.

Some embodiments include a select signal which allows one or more of the three input busses to be inverted within the LUT prior to the compression.

The invention also provides methods of implementing these adders in a PLD.

BRIEF DESCRIPTION OF THE DRAWINGS

The present invention is illustrated by way of example, and not by way of limitation, in the following figures.

DETAILED DESCRIPTION OF THE DRAWINGS

The present invention is applicable to a variety of programmable logic devices (PLDs). The present invention has been found to be particularly applicable and beneficial for field programmable gate arrays (FPGAs), and the invention is shown as applied to an exemplary FPGA architecture comprising slices, configurable logic blocks (CLBs), and lookup tables (LUTs), as described below in conjunction with the figures. Therefore, numerous specific details relating to this exemplary FPGA are set forth herein to provide a more thorough understanding of the present invention. However, it will be apparent to one skilled in the art that the present invention can be practiced without these specific details, and the present invention is not to be construed as being limited by the included examples.

Figure 1:
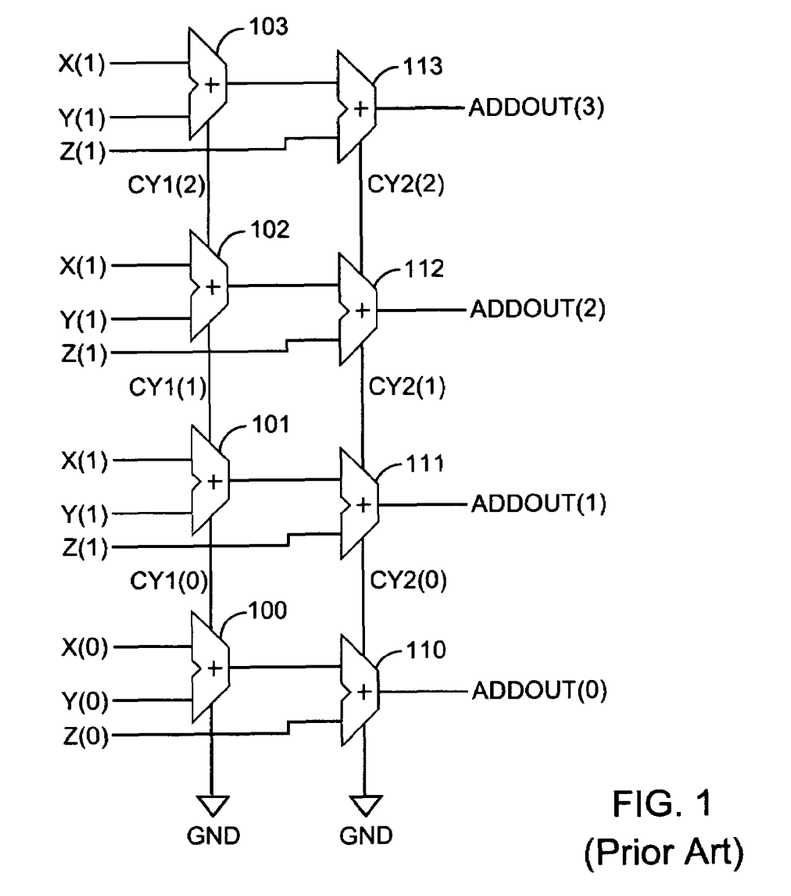
FIG. 1 illustrates a known implementation of a 3-input adder circuit that uses two carry chains.

One common DSP function is the add function, e.g., a 3-input add function. FIG. 1 shows a common implementation of a small exemplary 3-input adder circuit that implements the function ADDOUT(3:0)=X(1:0)+Y(1:0)+Z(1:0), where X, Y, and Z are 2-bit busses, and ADDOUT is a 4-bit bus. (The "plus" sign + in the equation denotes the add function.) Note that the exemplary adders illustrated herein all use two's-complement addition, in which the upper bits of the input busses are sign extended, as is explained in more detail in connection with FIG. 11, below. The adder of FIG. 1 is implemented as a series of 2-input cascade adders. Therefore, a 3-input adder requires two stages, as shown in FIG. 1. The first stage includes adders 100-103 and the second stage includes adders 110-113. Each stage has a carry chain. As illustrated, the first stage carry chain includes carry signals CIN1(0), CIN1(1), and CIN1(2), while the second stage includes carry signals CIN2(0), CIN2(1), and CIN2(2). Hence, two carry chains are required to implement the adder. In this implementation, the delays involved in getting onto and off of the two carry chains are typically sufficient to determine the overall speed of the adder, especially when the number of bits in the adder is large enough to be of practical use in today's systems.

Figure 2:
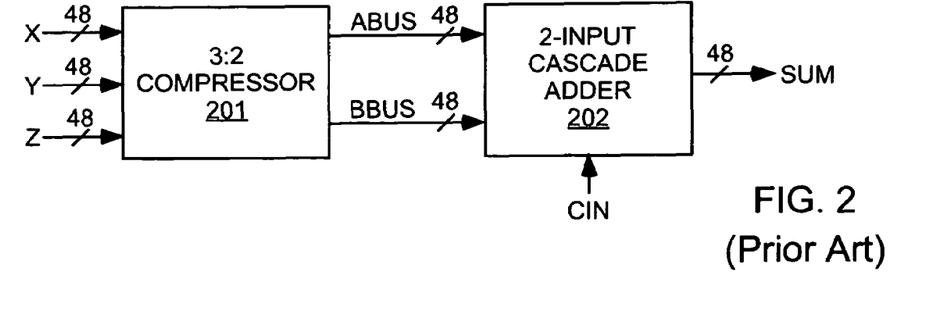
FIG. 2 illustrates a known implementation of a 3-input adder circuit that uses only one carry chain.

FIG. 2 illustrates another known implementation of a 3-input adder. In the implementation of FIG. 2, the three busses are first compressed to two busses having the same width as the three input busses. When a narrower bus is added, the narrower bus is sign extended by duplicating the most significant bit (MSB) to match the size of the other busses, or to match the size of the available hard-coded logic, e.g., 48 bits in the circuit shown in FIG. 2. The compression step is performed by 3:2 (3 to 2) compressor logic 201, which maps input busses X(n:0), Y(n:0), and Z(n:0) into two compressed busses ABUS(n:0) and BBUS (n:0). Compressed busses ABUS(n:0) and BBUS(n:0) are then added together in 2-input cascade adder 202 to form output bus SUM(n:0). The 2-input cascade adder 202 can be implemented, for example, in the same fashion as the final stage of the adder shown in FIG. 1.

Figure 3:
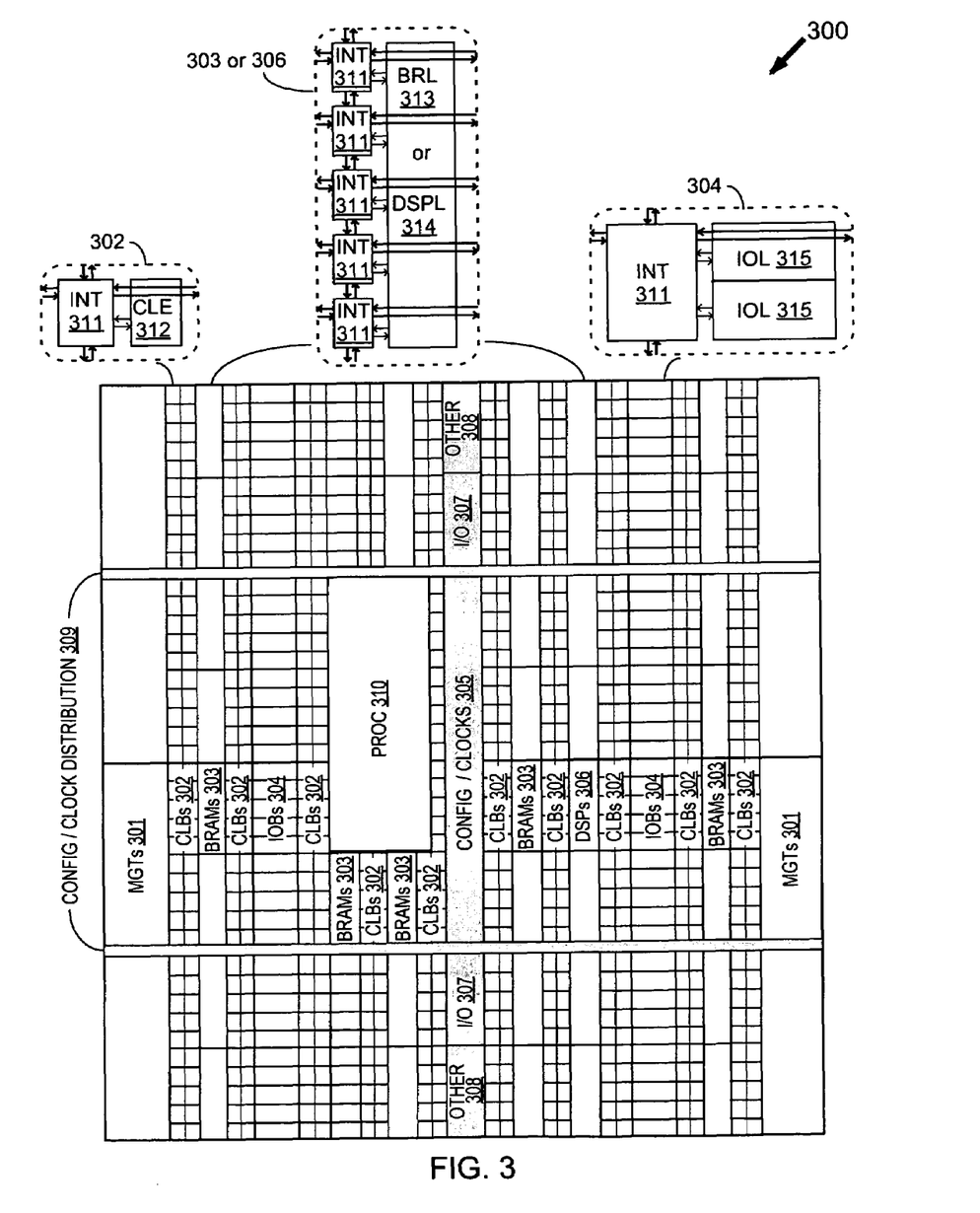
FIG. 3 illustrates a first FPGA architecture that includes several different types of programmable logic blocks.

As noted above, advanced FPGAs can include several different types of programmable logic blocks in the array. For example, FIG. 3 illustrates an FPGA architecture 300 that includes a large number of different programmable tiles including multi-gigabit transceivers (MGTs 301), configurable logic blocks (CLBs 302), random access memory blocks (BRAMs 303), input/output blocks (IOBs 304), configuration and clocking logic (CONFIG/CLOCKS 305), digital signal processing blocks (DSPs 306), specialized input/output blocks (I/O 307) (e.g., configuration ports and clock ports), and other programmable logic 308 such as digital clock managers, analog-to-digital converters, system monitoring logic, and so forth. Some FPGAs also include dedicated processor blocks (PROC 310).

In some FPGAs, each programmable tile includes a programmable interconnect element (INT 311) having standardized connections to and from a corresponding interconnect element in each adjacent tile. Therefore, the programmable interconnect elements taken together implement the programmable interconnect structure for the illustrated FPGA. The programmable interconnect element (INT 311) also includes the connections to and from the programmable logic element within the same tile, as shown by the examples included at the top of FIG. 3.

For example, a CLB 302 can include a configurable logic element (CLE 312) that can be programmed to implement user logic plus a single programmable interconnect element (INT 311). A BRAM 303 can include a BRAM logic element (BRL 313) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 306 can include a DSP logic element (DSPL 314) in addition to an appropriate number of programmable interconnect elements. An IOB 304 can include, for example, two instances of an input/output logic element (IOL 315) in addition to one instance of the programmable interconnect element (INT 311). As will be clear to those of skill in the art, the actual I/O pads connected, for example, to the I/O logic element 315 typically are not confined to the area of the input/output logic element 315. Note that the FPGA shown in FIG. 3 includes dedicated DSP logic elements 314 which can include, for example, 3-input adder circuits such as the circuit shown in FIG. 2.

In the pictured embodiment, a columnar area near the center of the die (shown shaded in FIG. 3) is used for configuration, clock, and other control logic. Horizontal areas 309 extending from this column are used to distribute the clocks and configuration signals across the breadth of the FPGA.

Some FPGAs utilizing the architecture illustrated in FIG. 3 include additional logic blocks that disrupt the regular columnar structure making up a large part of the FPGA. The additional logic blocks can be programmable blocks and/or dedicated logic. For example, the processor block PROC 310 shown in FIG. 3 spans several columns of CLBs and BRAMs.

Note that FIG. 3 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 3 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 4:
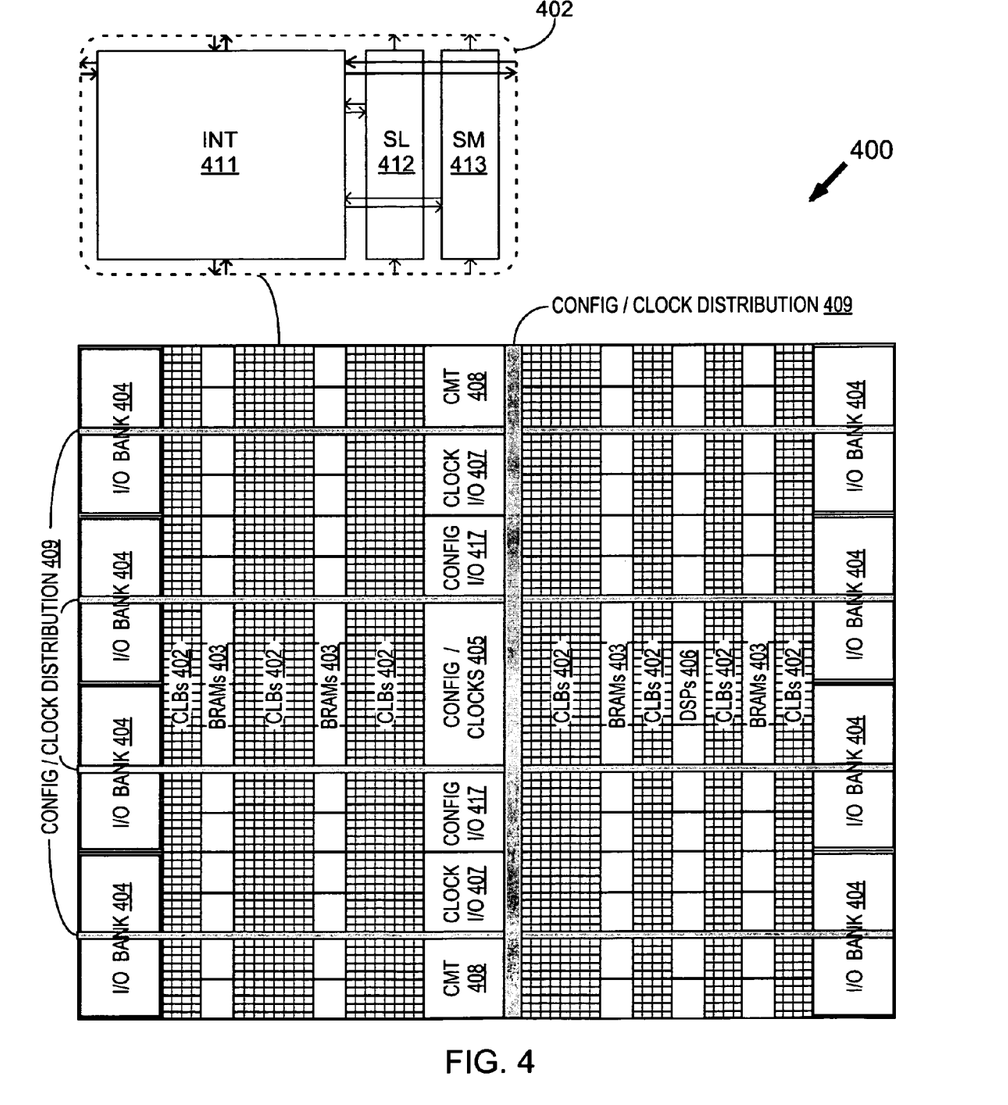
FIG. 4 illustrates a second FPGA architecture that includes several different types of programmable logic blocks.

FIG. 4 illustrates an exemplary FPGA 400 utilizing the general architecture shown in FIG. 3. The FPGA of FIG. 4 includes CLBs 402, BRAMs 403, I/O blocks divided into "I/O Banks" 404 (each including 40 I/O pads and the accompanying logic), configuration and clocking logic 405, DSP blocks 406, clock I/O 407, clock management circuitry (CMT) 408, configuration I/O 417, and configuration and clock distribution areas 409.

In the FPGA of FIG. 4, an exemplary CLB 402 includes a single programmable interconnect element (INT 411) and two different "slices", slice L (SL 412) and slice M (SM 413). In some embodiments, the two slices are the same (e.g., two copies of slice L, or two copies of slice M). In other embodiments, the two slices have different capabilities. In some embodiments, some CLBs include two different slices and some CLBs include two similar slices. For example, in some embodiments some CLB columns include only CLBs with two different slices, while other CLB columns include only CLBs with two similar slices.

Figure 5:
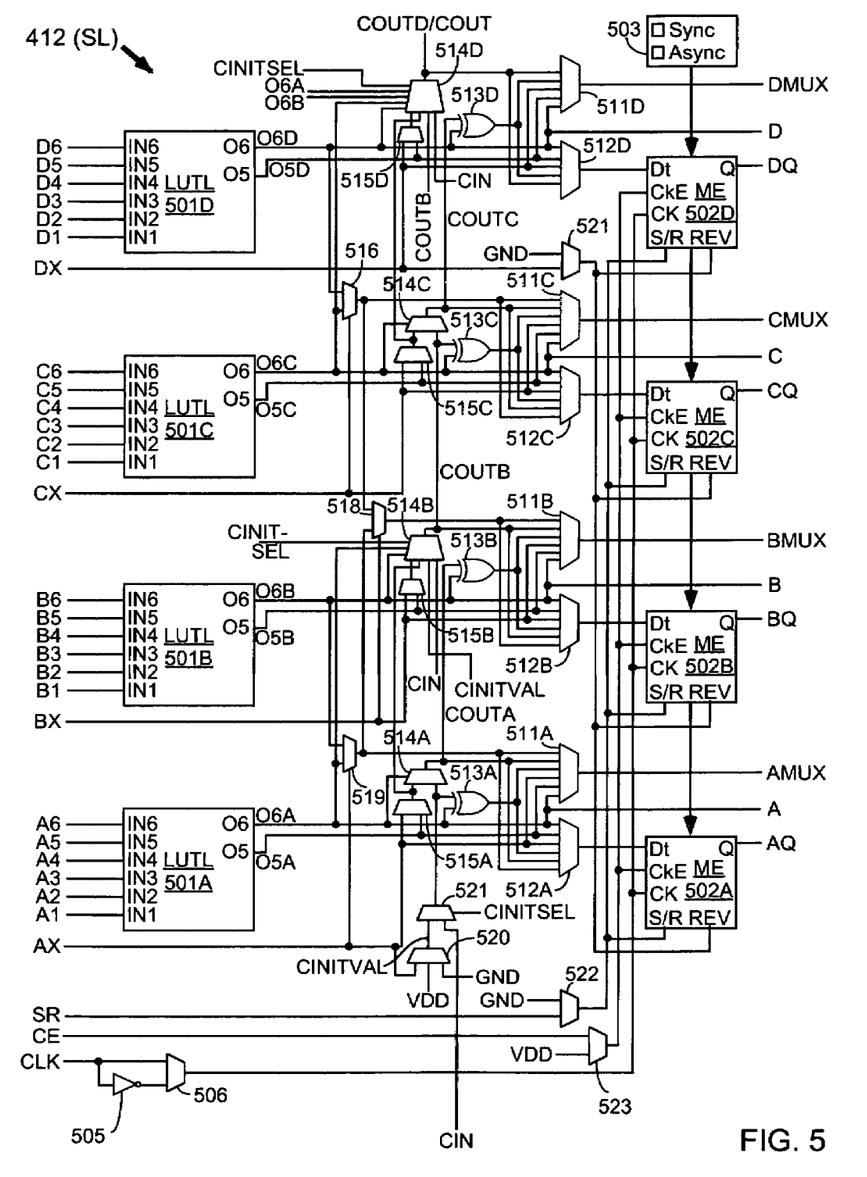
FIG. 5 illustrates a first programmable "slice" that can be included, for example, in the FPGAs of FIGS. 3 and 4.

FIG. 5 illustrates one embodiment of slice L (SL 412) that can be used, for example, in the FPGA of FIG. 4. In some embodiments, CLB 402 includes two or more copies of slice 412. In other embodiments, only one copy of slice 412 is included in each CLB. In other embodiments, the CLBs are implemented without using slices or using slices other than those shown in the figures herein.

In the embodiment of FIG. 5, slice L includes four lookup tables (LUTLs) 501A-501D, each driven by six LUT data input terminals A1-A6, B1-B6, C1-C6, and D1-D6 and each providing two LUT output signals O5 and O6. (In the present specification, the same reference characters are used to refer to terminals, signal lines, and their corresponding signals.) The O6 output terminals from LUTs 501A-501D drive slice output terminals A-D, respectively. The LUT data input signals are supplied by the FPGA interconnect structure (not shown in FIG. 5) via input multiplexers (not shown in FIG. 5), and the LUT output signals are also supplied to the interconnect structure. Slice L also includes: output select multiplexers 511A-511D driving output terminals AMUX-DMUX; multiplexers 512A-512D driving the data input terminals of memory elements 502A-502D; combinational multiplexers 516, 518, and 519; bounce multiplexer circuits 522-523; a circuit represented by inverter 505 and multiplexer 506 (which together provide an optional inversion on the input clock path); and carry logic comprising multiplexers 514A-514D, 515A-515D, 520-521 and exclusive OR gates 513A-513D. All of these elements are coupled together as shown in FIG. 5. Where select inputs are not shown for the multiplexers illustrated in FIG. 5, the select inputs are controlled by configuration memory cells. These configuration memory cells, which are well known, are omitted from FIG. 5 for clarity, as from other selected figures herein.

In the pictured embodiment, each memory element 502A-502D can be programmed to function as a synchronous or asynchronous flip-flop or latch. The selection between synchronous and asynchronous functionality is made for all four memory elements in a slice by programming Sync/Asynch selection circuit 503. When a memory element is programmed so that the S/R (set/reset) input signal provides a set function, the REV input terminal provides the reset function. When the memory element is programmed so that the S/R input signal provides a reset function, the REV input terminal provides the set function. Memory elements 502A-502D are clocked by a clock signal CK, e.g., provided by a global clock network or by the interconnect structure. Such programmable memory elements are well known in the art of FPGA design. Each memory element 502A-502D provides a registered output signal AQ-DQ to the interconnect structure.

Each LUT 501A-501D provides two output signals, O5 and O6. The LUT can be configured to function as two 5-input LUTs with five shared input signals (IN1-IN5), or as one 6-input LUT having input signals IN1-1N6. Each LUT 501A-501D can be implemented, for example, as shown in FIG. 6.

Figure 6:
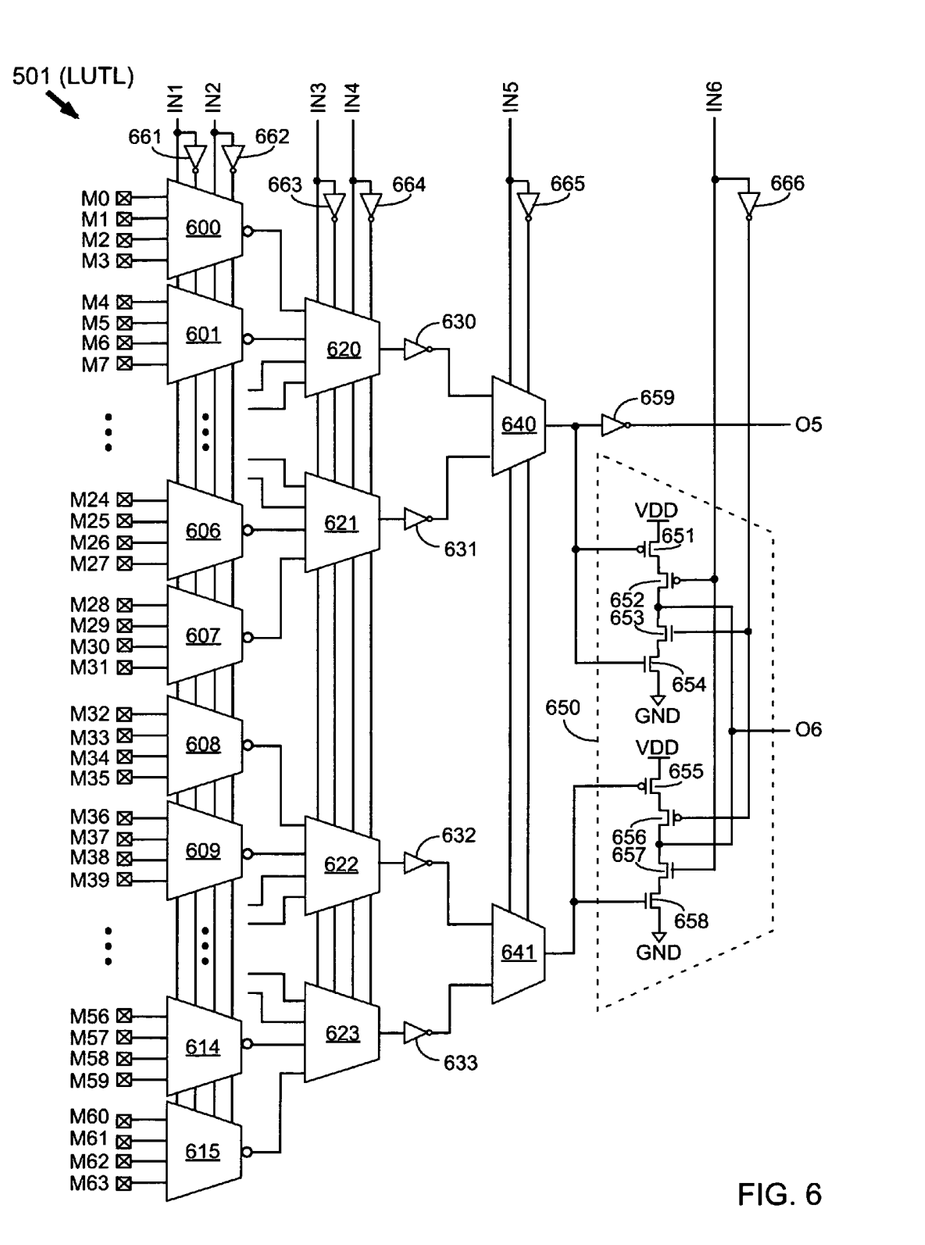
FIG. 6 illustrates an exemplary lookup table (LUT) that can be included, for example, in the slice of FIG. 5.

In the embodiment of FIG. 6, configuration memory cells M0-M63 drive 4-to-1 multiplexers 600-615, which are controlled by input signals IN1, IN2 and their inverted counterparts (provided by inverters 661, 662) to select 16 of the signals from the configuration memory cells. The selected 16 signals drive four 4-to-1 multiplexers 620-623, which are controlled by input signals IN3, IN4 and their inverted counterparts (provided by inverters 663, 664) to select four of the signals to drive inverters 630-633. Inverters 630-633 drive 2-to-1 multiplexers 640-641, which are controlled by input signal IN5 and its inverted counterpart (provided by inverter 665). The output of multiplexer 640 is inverted by inverter 659 and provides output signal O5. Thus, output signal O5 can provide any function of up to five input signals, IN1-IN5. Inverters can be inserted wherever desired in the multiplexer structure, with an additional inversion being nullified by simply storing inverted data in the configuration memory cells M0-M63. For example, the embodiment of FIG. 6 shows bubbles on the output terminals of multiplexers 600-615, which signifies an inversion (e.g., an inverter) on the output of each of these multiplexers.

Multiplexers 640 and 641 both drive data input terminals of multiplexer 650, which is controlled by input signal IN6 and its inverted counterpart (provided by inverter 666) to select either of the two signals from multiplexers 640-641 to drive output terminal O6. Thus, output signal O6 can either provide any function of up to five input signals IN1-IN5 (when multiplexer 650 selects the output of multiplexer 641, i.e., when signal IN6 is high), or any function of up to six input signals IN1-1N6.

In the pictured embodiment, multiplexer 650 is implemented as two three-state buffers, where one buffer is driving and the other buffer is disabled at all times. The first buffer includes transistors 651-654, and the second buffer includes transistors 655-658, coupled together as shown in FIG. 6.

Figure 7:
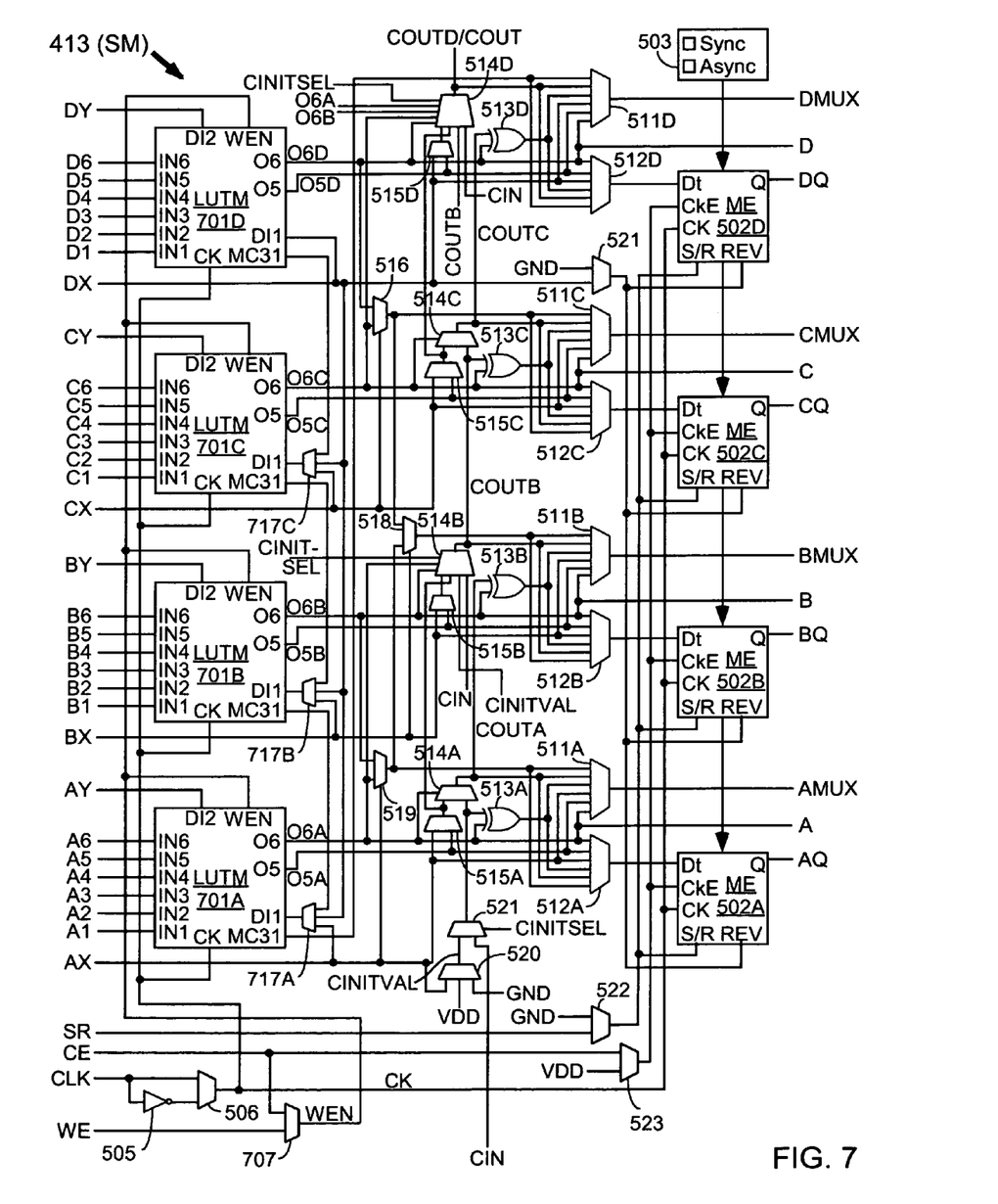
FIG. 7 illustrates a second programmable slice that can be included, for example, in the FPGAs of FIGS. 3 and 4.

FIG. 7 illustrates one embodiment of slice M (SM 413) that can be used, for example, in the FPGA of FIG. 4. In some embodiments, CLB 402 includes two or more copies of slice 413. In other embodiments, only one copy of slice 413 is included in each CLB. In other embodiments, the CLBs are implemented without using slices or using slices other than those shown in the figures herein.

Slice M is similar to slice L of FIG. 5, except for added functionality in the LUTs and additional circuitry associated with this added functionality. Similar elements are numbered in a similar manner to those in FIG. 5. In the embodiment of FIG. 7, each LUTM 701A-701D can function in any of several modes. When in lookup table mode, each LUT has six data input signals IN1-1N6 that are supplied by the FPGA interconnect structure (not shown in FIG. 7) via input multiplexers (not shown in FIG. 7). One of 64 data values is programmably selected from configuration memory cells based on the values of signals IN1-1N6, as in the embodiment of FIG. 6. When in RAM mode, each LUT functions as a single 64-bit RAM or two 32-bit RAMs with shared addressing. The RAM write data is supplied to the 64-bit RAM via input terminal DI1 (via multiplexers 717A-717C for LUTs 701A-701C), or to the two 32-bit RAMs via input terminals DI1 and DI2. RAM write operations in the LUT RAMs are controlled by clock signal CK from multiplexer 506 and by write enable signal WEN from multiplexer 707, which can selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals can be provided through the LUT output terminals, and the 32-bit shift out signal can also be provided more directly via LUT output terminal MC31. The 32-bit shift out signal MC31 of LUT 701A can also be provided to the general interconnect structure for shift register chaining, via output select multiplexer 511D and CLE output terminal DMUX.

Figure 8:
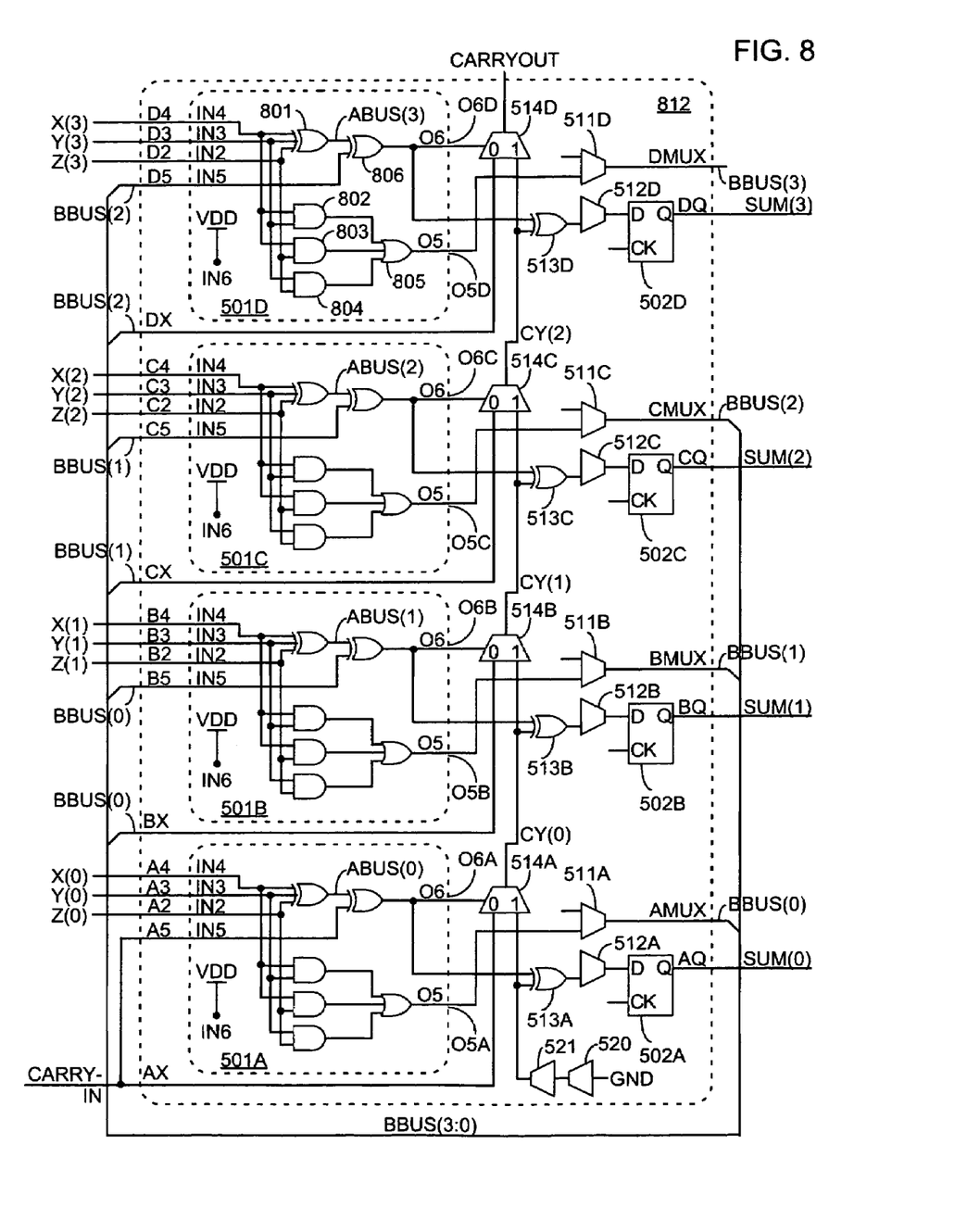
FIG. 8 illustrates a novel implementation of a 3-input adder circuit using the slice of FIG. 5.

FIG. 8 illustrates a novel implementation of a 3-input adder circuit implemented using the slice of FIG. 5. The illustrated circuit also maps into the slice of FIG. 7 in the same manner as that shown. The first four bits of the 3-input adder circuit are illustrated. However, it will be clear to those of skill in the art that the circuit can be extended to accommodate adders larger than 4 bits, or reduced to accommodate adders of fewer than 4 bits. Additionally, multiplexers 511A-511D and 512A-512D are optional, and are included simply to clearly map the circuit of FIG. 8 to the slices shown in FIGS. 5 and 7. The flip-flops 502A-502D are also optional. When the slices of FIGS. 5 and 7 are used, the flip-flops 502A-502D can be included for pipelined designs, or can be configured as flow-through latches with the clock inputs CK tied high, when the adder output is not registered.

In the embodiment of FIG. 8, the dual-output LUTs 501A-501D are used to implement a 3:2 compression circuit, and also part of a 2-input cascade adder. The 3:2 compression circuit produces two busses, ABUS and BBUS. Applying the well known equations for a 3:2 compression circuit (also known as a carry save adder) results in the following:

$$ABUS(n)=X(n) \text{ XOR } Y(n) \text{ XOR } Z(n) \tag{1}$$

$$BBUS(n)=X(n)Y(n) \text{ OR } X(n)Z(n) \text{ OR } Y(n)Z(n) \tag{2}$$

The logic generating bus ABUS(3), for example (see equation (1)) is shown in FIG. 8 as including 3-input XOR gate 801. The logic generating signal BBUS(3), for example (see equation (2)) is shown in FIG. 8 as AND gates 802-804 and OR gate 805, coupled together as shown in FIG. 8. Of course, because LUTs 501A-501D are lookup tables, these logic gates are not physically included in the PLD, but the appropriate functions are programmed into the lookup tables. In the pictured embodiment, the BBUS output is provided on the O5 output of the LUT (see FIG. 6), and hence via output select multiplexer 511A-511D to a slice output terminal BBUS(3:0). The ABUS output is internal to the LUT, as shown in FIG. 8. The 3:2 compressor implementation (e.g., the ABUS and BBUS generation logic) constitutes the logic shown in area 901 of FIG. 9.

Figure 9:
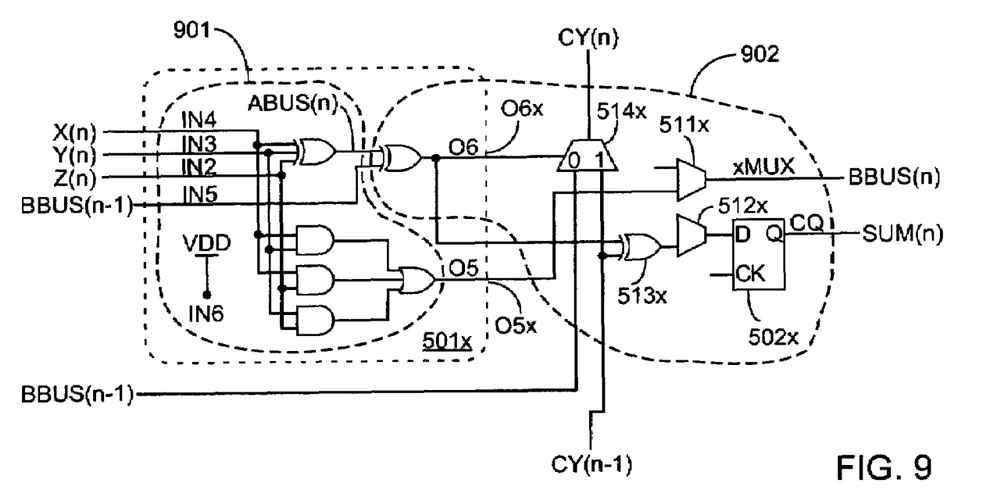
FIG. 9 illustrates how the compressor logic and the adder logic are distributed for each bit in the adder implementation shown in FIG. 8.

Each bit of the 2-input cascade adder adds together two bits: the nth bit of the ABUS, and the (n−1)st bit of the BBUS. This addition is performed partially in the LUT and partially in the other programmable logic elements of the slice. For example, the logic generating signal SUM(3) is shown in FIG. 8 as being generated using XOR gates 806 and 513D, coupled together as shown in FIG. 8, and then registered in memory element 502D. Applying the well known equations for a 2-input full adder would result in the following:

$$SUM(n)=ABUS(n) \text{ XOR } BBUS(n-1) \text{ XOR } CY(n-1) \tag{3}$$

$$CY(n)=CY(n-1)[ABUS(n) \text{ OR } BBUS(n-1)] \text{ OR } ABUS(n)BBUS(n-1) \tag{4}$$

where CY(n−1) is the carry in signal and CY(n) is the carry out signal for the nth bit of the 2-input full adder (see FIG. 9).

In the pictured embodiments, equation (4) is not used. By increasing the complexity of the equation for CY(n), the amount of logic required to implement the circuit for CY(n) can actually be reduced by taking advantage of the properties of the dual-output lookup table. In the pictured embodiments, the carry out signal CY(n) is implemented as follows:

$$CY(n)=BBUS(n-1) \text{ AND NOT } [ABUS(n) \text{ XOR } BBUS(n-1)] \text{ OR } CY(n-1) \text{ AND } [ABUS(n) \text{ XOR } BBUS(n-1)] \tag{5}$$

This implementation allows a portion of the logic of the 2-input cascade adder to be included in the dual-output LUT, as shown, for example, in FIG. 9. In FIG. 9, the 2-input cascade adder logic constitutes the logic shown in area 902.

Note that in the embodiment of FIG. 8, the BBUS(n) output signals are routed from the slice output terminals AMUX-CMUX (and DMUX, for larger numbers of bits) around to the slice input terminals BX-DX (and AX, for larger numbers of bits) and B5-D5 (and A5, for larger numbers of bits). In some embodiments, these paths are included in the critical paths for the circuit. The critical paths might include, for example, any of the paths from an O5 LUT output terminal through the associated output select multiplexer 511A-511D, through one of the slice output-to-input routing paths just described, through the A5-D5 slice input terminal to the associated IN5 LUT input terminal, through the LUT to the O6 LUT output terminal to the carry multiplexer 514A-514D, XOR gate 513A-513D, multiplexer 512A-512D, and hence to the associated memory element 502A-502D. Therefore, it is logical to assign the fastest LUT input pin to a signal on this path. It is clear from FIG. 6 that IN5 is the fastest available LUT input terminal. (The IN6 input terminal is not available, because it is tied to power high VDD to configure the LUT as two 5-input LUTs.) Therefore, in some embodiments the signal BBUS (n) is brought into the LUT on the IN5 input terminal. The X(n), Y(n), and Z(n) input signals are brought into the LUT on any of the remaining terminals. In some embodiments, the LUT input terminals assigned to the X(n), Y(n), and Z(n) input signals are those shown in FIG. 8. In some embodiments, the LUT input terminals are assigned for other reasons, or in a random fashion.

Note that the BBUS signals are also routed to the AX-DX input terminals, as shown in FIG. 8. The direct input terminals AX-DX are selected for this function because they provide access to the carry multiplexers 514A-514D.

In some embodiments, fast feedback paths are provided between the AMUX-DMUX output terminals and the AX-DX input terminals of the LUT. These paths are designed to provide relatively fast feedback paths between output terminals and input terminals of the slice, and can be used for feedback paths such as those described above and shown in FIG. 8. In some embodiments, the BBUS(n) feedback paths are deliberately routed using these fast feedback paths.

It will be clear to those of skill in the art that a larger 3-input adder circuit can be built by repeating the top bit of the implementation shown in FIG. 8, e.g., in an adjacent slice located "above" the slice shown in FIG. 8. The connections for the least significant bit (LSB), however, are different from the other bits, in that the logic for the LSB initializes the carry chain. FIG. 8 shows two different methods of initializing the carry chain. Note that in other PLDs, other methods may be included for initializing the carry chain. As will be clear to those of skill in the art, these other methods can also be used in conjunction with the present invention.

A first method of initializing the carry chain is to provide a carry in value to the first multiplexer in the carry chain. For example, FIG. 8 shows the application of a CARRYIN signal to the "0" input of the carry multiplexer 514A. Note that the CARRYIN signal is also applied to the logic for generating the signal SUM(0). Thus, in the pictured embodiment the equation for the signal SUM(0) is:

$$\text{SUM}(0)=A\text{BUS}(0) \text{ XOR CARRYIN XOR } GND \tag{6}$$

with the ground signal GND being supplied by the programmable initialization multiplexers 520 and 521. This equation can be simplified to:

$$\text{SUM}(0)=A\text{BUS}(0) \text{ XOR CARRYIN} \tag{7}$$

In the exemplary FPGA, the CARRYIN signal can simply be tied to ground, if desired. In this case, the equation can be stated even more simply as:

$$\text{SUM}(0)=A\text{BUS}(0) \tag{8}$$

Figure 10:
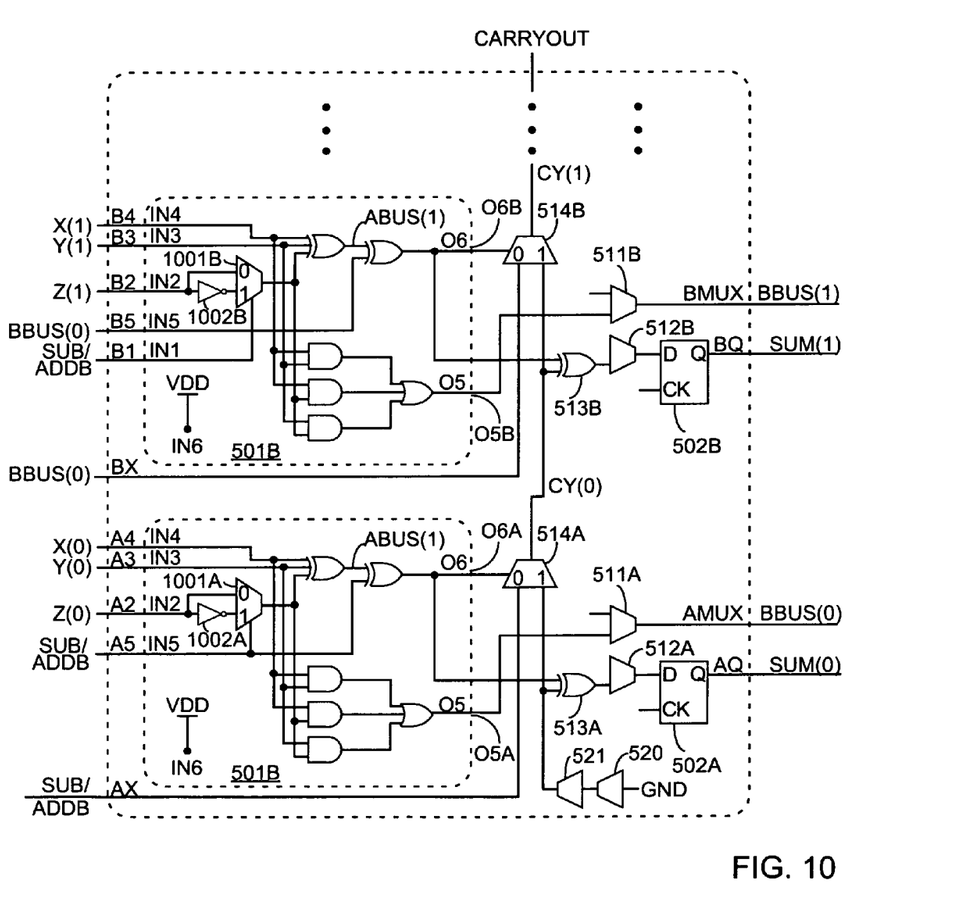
FIG. 10 illustrates a novel implementation of a 3-input adder/subtractor circuit using the slice of FIG. 5.

The flexibility of the dual-output LUT can also be used to provide additional functionality for the adder circuit, by providing a dynamic add/subtract selection capability. For example, FIG. 10 illustrates a novel implementation of a 3-input adder/subtractor circuit using the slice of FIG. 5. Note that only the two least significant bits of the adder/subtractor are illustrated. To extend the circuit to encompass more bits, the logic for the "1" bit can be repeated as many times as is necessary or desirable. For simplicity, the terms "adder" and "adder circuit" as used herein extend to adders, subtractors, and adder/subtractor circuits, e.g., the adder/subtractor circuit shown in FIG. 10.

The adder circuit of FIG. 10 is similar to the first two bits of the circuit of FIG. 8, so only the differences are described here. All of the changes are included in the dual-output LUT, so no additional hard-coded or programmable logic resources are consumed by the adder of FIG. 10. Of course, the subtract/addbar select signal SUB/ADDB is generated and routed to each LUT in the adder, as shown in FIG. 10, which may consume additional logic and routing resources. The new logic implemented in the LUT includes a multiplexer 1001A-1001B and an inverter 1002A-1002B. When signal SUB/ADDB is high, the Z(n) input is inverted as it goes into the LUT. When signal SUB/ADDB is low, the Z(n) input is not inverted. In this embodiment, the SUB/ADDB signal also functions as the CARRYIN signal (see bit "0" of FIG. 8), and drives the A5 and AX input terminals of the slice. Thus, depending on the value of the signal SUB/ADDB, the function implemented by the adder circuit is as follows:

$$\text{SUM}=X+Y+Z \text{(when signal SUB/ADD}B \text{ is low)} \tag{9}$$

or $$\text{SUM}=X+Y-Z \text{(when signal SUB/ADD}B \text{ is high)} \tag{10}$$

where the "+" sign indicates an addition function and the "−" sign indicates a subtraction function.

Note that a similar technique could be used to optionally invert either or both of the other two inputs X and Y.

Figure 11:
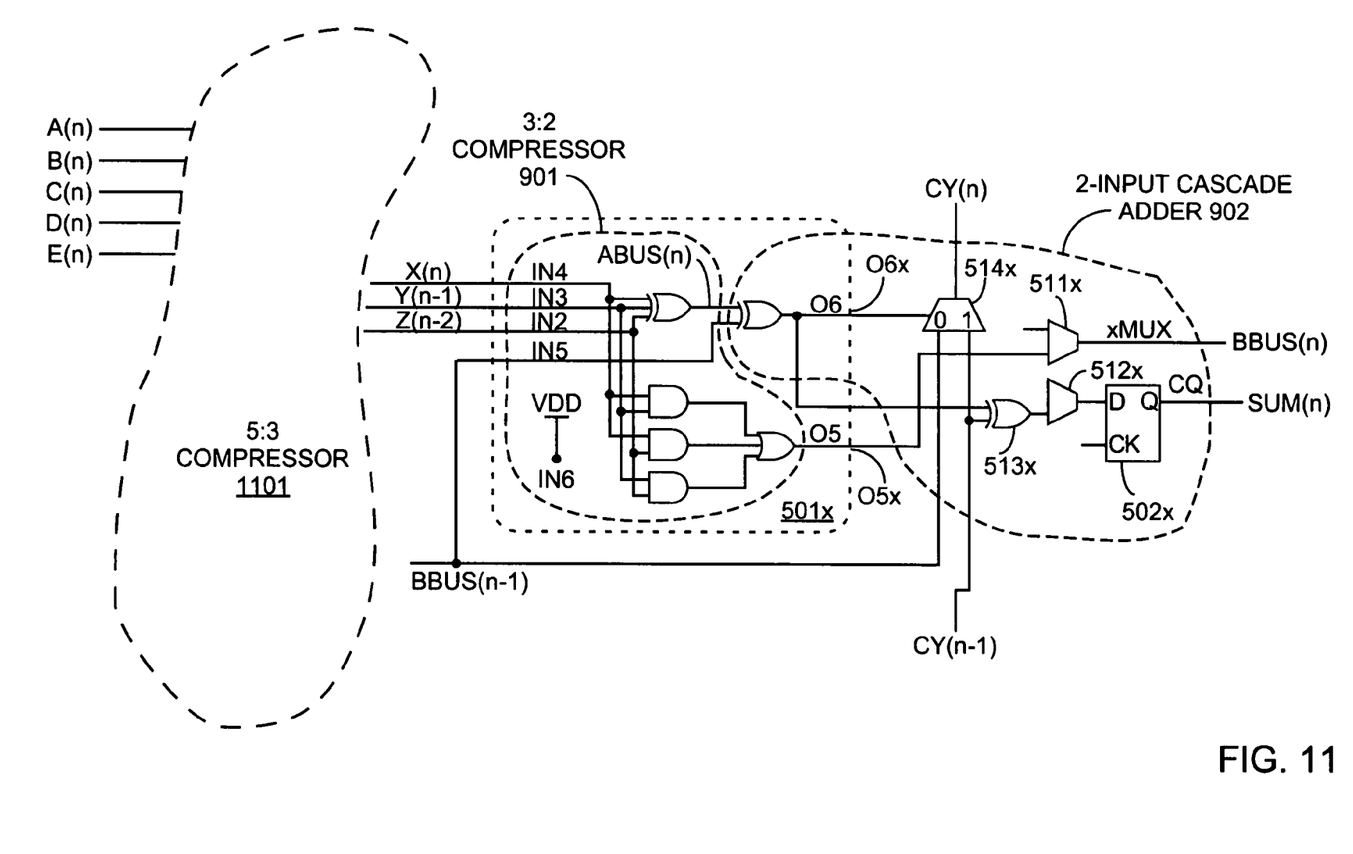
FIG. 11 illustrates how the implementation of FIG. 9 can be combined with a 5:3 compressor to provide an efficient PLD implementation of a 5-input adder.

The adder circuits shown herein can also be included in larger circuits to implement adders with more than three inputs. For example, FIG. 11 illustrates how the implementation of FIG. 9 can be combined with a 5:3 compressor to provide an efficient PLD implementation of a 5-input adder. Note that, as in FIG. 9, only the nth bit of the adder circuit is shown in FIG. 11. Except for the two least significant bits, all of the bits can be implemented as shown in FIG. 11. The least significant bit (LSB) of the 3:2 compressor and the 2-input cascade adder circuit can implemented, for example, by replacing one or two of the input signals with ground connections, or by simplifying the logic to eliminate the unnecessary inputs altogether. It will be clear to those of skill in the art that a subtractor circuit or an adder/subtractor circuit can easily be implemented in a similar fashion.

The 5-input adder circuit of FIG. 11 includes a 5:3 (5 to 3) compressor 1101, driving an adder circuit similar, for example, to that of FIG. 9. The 5:3 compressor 1101 generates three busses X, Y, and Z from five input busses A, B, C, D, E. Each bit of busses X, Y, and Z is generated as follows:

$$X(n)=A(n) \text{ XOR } B(n) \text{ XOR } C(n) \text{ XOR } D(n) \text{ XOR } E(n) \tag{11}$$

$$Y(n)=A(n)B(n) \text{ XOR } A(n)C(n) \text{ XOR } A(n)D(n) \text{ XOR } A(n)E(n) \text{ XOR } B(n)C(n) \text{ XOR } B(n)D(n) \text{ XOR } B(n)E(n) \text{ XOR } C(n)D(n) \text{ XOR } C(n)E(n) \text{ XOR } D(n)E(n) \tag{12}$$

$$Z(n)=A(n)B(n)C(n)D(n) \text{ OR } A(n)B(n)C(n)E(n) \text{ OR } A(n)B(n)D(n)E(n) \text{ OR } A(n)C(n)D(n)E(n) \text{ OR } B(n)C(n)D(n)E(n) \tag{13}$$

Note that each bit X(n), Y(n), and Z(n) in equations (11)-(13) is based on only five values A(n), B(n), C(n), D(n), and E(n). Therefore, in the FPGA slices illustrated in FIGS. 5-7, for example, each bit of busses X, Y, and Z can be generated using only half of a LUT, with the LUT being configured as two 5-input LUTs with shared input signals. Thus, two LUTs would be required to implement X, Y, and Z for each bit.

As shown in FIG. 11, the Y bus is left-shifted by one bit compared to the X bus, and the Z bus is left-shifted by one bit compared to the Y bus (by two bits compared to the X bus), before the three busses are provided to the 3:2 compressor 901. In other words, bits X(n), Y(n−1), and Z(n−2) are combined to form compressed bus bits ABUS(n) and BBUS(n). To implement the high-end bits, i.e., to fill in the "missing" bits, the X, Y, and Z busses are "sign extended". Sign extension is a well known technique applied to two's complement input values, in which the most significant bit (MSB) of a bus is duplicated to fill in empty spaces at the upper end of a bus. In this instance, the MSB of bus X is copied to fill in the top 3 bits of bus X, the MSB of bus Y is copied to fill in the top two bits of bus Y, and the MSB of bus Z is copied to fill in the top bit of bus Z.

In one simple example, busses A-E are 4-bit busses, bus Z is a 5-bit bus (sign extended by one bit), bus Y is a 6-bit bus (sign extended by two bits), and bus X is a 7-bit bus (sign extended by three bits). Thus, for example, the bit values of compressed bus ABUS can be derived as follows:

$$A\text{BUS}(0)=X(0) \tag{14}$$

$$A\text{BUS}(1)=X(1) \text{ XOR } Y(0) \tag{15}$$

$$A\text{BUS}(2)=X(2) \text{ XOR } Y(1) \text{ XOR } Z(0) \tag{16}$$

$$A\text{BUS}(3)=X(3) \text{ XOR } Y(2) \text{ XOR } Z(1) \tag{17}$$

$$A\text{BUS}(4)=X(3) \text{ XOR } Y(3) \text{ XOR } Z(2) \tag{18}$$

$$A\text{BUS}(5)=X(3) \text{ XOR } Y(3) \text{ XOR } Z(3) \tag{19}$$

$$A\text{BUS}(6)=X(3) \text{ XOR } Y(3) \text{ XOR } Z(3) \tag{20}$$

and the bit values of compressed bus BBUS can be derived as follows:

$$BBUS(0)=0 \quad (21)$$

$$BBUS(1)=X(1)Y(0) \quad (22)$$

$$BBUS(2)=X(2)Y(1) \text{ OR } X(2)Z(0) \text{ OR } Y(1)Z(0) \quad (23)$$

$$BBUS(3)=X(3)Y(2) \text{ OR } X(3)Z(1) \text{ OR } Y(2)Z(1) \quad (24)$$

$$BBUS(4)=X(3)Y(3) \text{ OR } X(3)Z(2) \text{ OR } Y(3)Z(2) \quad (25)$$

$$BBUS(5)=X(3)Y(3) \text{ OR } X(3)Z(3) \text{ OR } Y(3)Z(3) \quad (26)$$

The compressed busses ABUS and BBUS are then added together using a 2-input cascade adder 902 in the same fashion as was previously shown in FIG. 9, resulting in a 7-bit output bus SUM(6:0) and a carry output signal CY(6).

Figure 12:
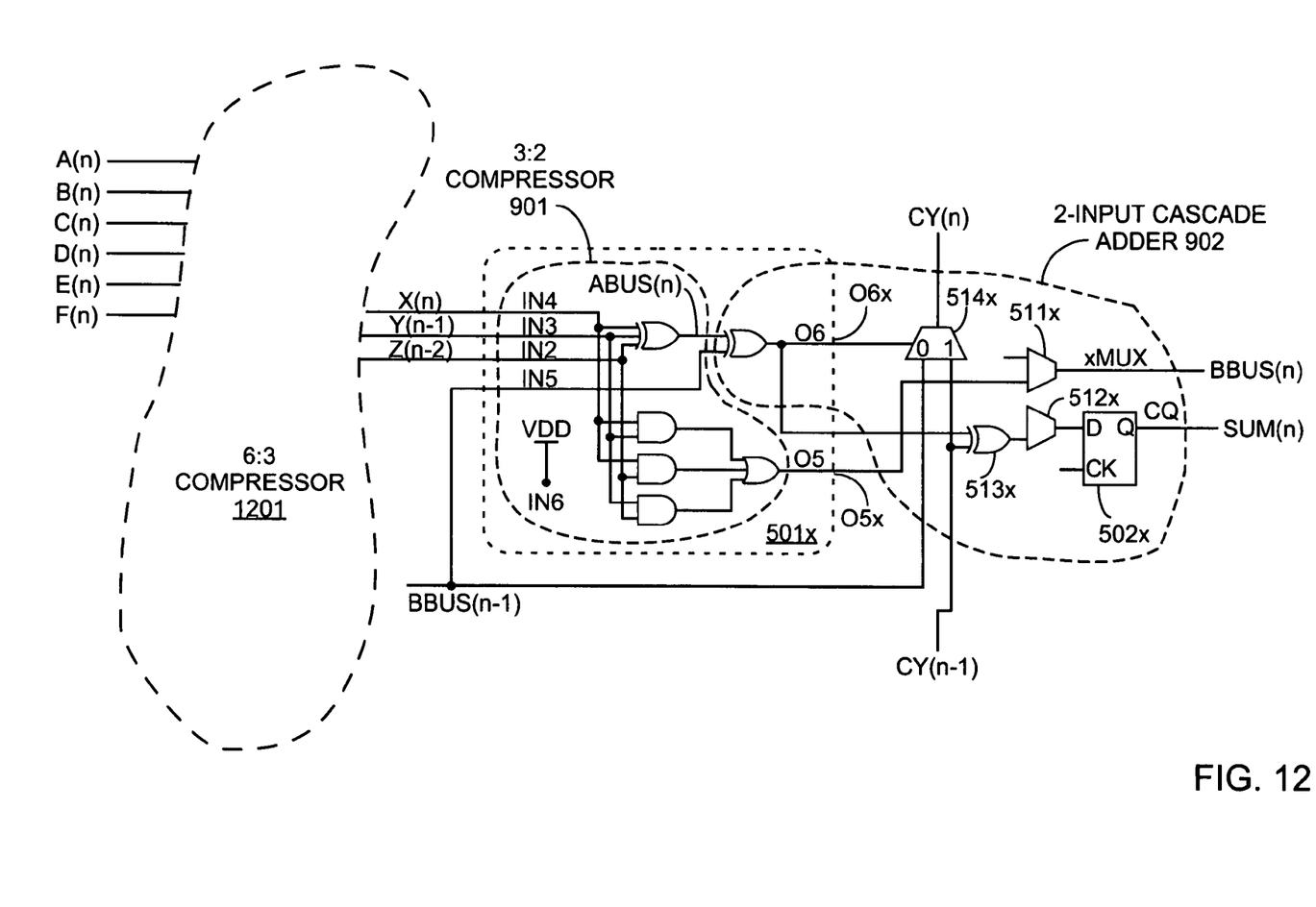
FIG. 12 illustrates how the implementation of FIG. 9 can be combined with a 6:3 compressor to provide an efficient PLD implementation of a 6-input adder.

FIG. 12 illustrates how the implementation of FIG. 9 can be combined with a 6:3 compressor to provide an efficient PLD implementation of a 6-input adder. Note that, as in FIG. 9, only the nth bit of the adder circuit is shown in FIG. 12. Except for the two least significant bits, all of the bits can be implemented as shown in FIG. 12. The two least significant bits (LSBs) of the 3:2 compressor and the 2-input cascade adder circuit can implemented, for example, by replacing one or two of the input signals with ground connections, or by simplifying the logic to eliminate the unnecessary inputs altogether. It will be clear to those of skill in the art that a subtractor circuit or an adder/subtractor circuit can easily be implemented in a similar fashion.

The 6-input adder circuit of FIG. 12 includes a 6:3 (6 to 3) compressor 1201, driving an adder circuit similar, for example, to that of FIG. 9. The 6:3 compressor 1201 generates three busses X, Y, and Z from six input busses A, B, C, D, E, F. Each bit of busses X, Y, and Z is generated as follows:

$$X(n)=A(n) \text{ XOR } B(n) \text{ XOR } C(n) \text{ XOR } D(n) \text{ XOR } E(n) \text{ XOR } F(n) \quad (27)$$

$$Y(n)=A(n)B(n) \text{ XOR } A(n)C(n) \text{ XOR } A(n)D(n) \text{ XOR } A(n)E(n) \text{ XOR } A(n)F(n) \text{ XOR } B(n)C(n) \text{ XOR } B(n)D(n) \text{ XOR } B(n)E(n) \text{ XOR } B(n)F(n) \text{ XOR } C(n)D(n) \text{ XOR } C(n)E(n) \text{ XOR } C(n)F(n) \text{ XOR } D(n)E(n) \text{ XOR } D(n)F(n) \text{ XOR } E(n)F(n) \quad (28)$$

$$Z(n)=A(n)B(n)C(n)D(n) \text{ OR } A(n)B(n)C(n)E(n) \text{ OR } A(n)B(n)C(n)F(n) \text{ OR } A(n)B(n)D(n)E(n) \text{ OR } A(n)B(n)D(n)F(n) \text{ OR } A(n)B(n)E(n)F(n) \text{ OR } A(n)C(n)D(n)E(n) \text{ OR } A(n)C(n)D(n)F(n) \text{ OR } A(n)C(n)E(n)F(n) \text{ OR } A(n)D(n)E(n)F(n) \text{ OR } B(n)C(n)D(n)E(n) \text{ OR } B(n)C(n)D(n)F(n) \text{ OR } B(n)C(n)E(n)F(n) \text{ OR } B(n)D(n)E(n)F(n) \text{ OR } C(n)D(n)E(n)F(n) \quad (29)$$

Note that each bit X(n), Y(n), and Z(n) in equations (30)-(32) is based on only six values A(n), B(n), C(n), D(n), E(n), and F(n). Therefore, in the FPGA slices illustrated in FIGS. 5-7, for example, each bit of busses X, Y, and Z can be generated using only one of the 6-input LUTs. Thus, three LUTs would be required to implement X, Y, and Z for each bit.

As in the embodiment of FIG. 11, the Y bus is left-shifted by one bit compared to the X bus, and the Z bus is left-shifted by one bit compared to the Y bus (by two bits compared to the X bus), before the three busses are provided to the 3:2 compressor 901. In other words, bits X(n), Y(n−1), and Z(n−2) are combined to form compressed bus bits ABUS(n) and BBUS(n). To implement the high-end bits, i.e., to fill in the "missing" bits, the X, Y, and Z busses are sign extended as described in connection with FIG. 11, above. The bit values of compressed busses ABUS and BBUS are also derived from busses X, Y, and Z in the same fashion as described above in conjunction with FIG. 11. The compressed busses ABUS and BBUS are then added together using a 2-input cascade adder 902 in the same fashion as was previously shown in FIG. 9.

Even wider adders can be implemented by using multiple stages of the 5:3 and 6:3 compressors. For example, a 25-input adder (not shown) can be implemented using a first stage including five 5:3 compressors, followed by a second stage including three 5:3 compressors, a third stage including two 5:3 compressors, and a fourth stage including one 6:3 compressor, followed by the 3:2 compressor and a 2-input cascade adder similar to those shown, for example, in FIG. 12.

As another example, a 24-input adder (not shown) can be implemented using multiple levels of the 6:3 compressor. The 24-input adder can include a first stage including four 6:3 compressors, followed by a second stage including two 6:3 compressors, and a third stage including one 6:3 compressor, followed by the 3:2 compressor and a 2-input cascade adder similar to those shown, for example, in FIG. 12.

Other sizes of compressors can also be implemented using the exemplary methods and structures described above. For example, compressors having sizes other than 5:3 and 6:3 can be combined with the 3:2 compressor and the 2-input cascade adder utilized in the circuits herein.

Those having skill in the relevant arts of the invention will now perceive various modifications and additions that can be made as a result of the disclosure herein. For example, AND gates, OR gates, XOR gates, inverters, multiplexers, memory elements, flip-flops, compressors, 5:3 compressors, 6:3 compressors, lookup tables, slices, CLBs, FPGAs, PLDs, and other components and elements other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known. It will be apparent to one skilled in the art after reading this specification that the present invention can be practiced within these and other architectural variations.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. An adder circuit implemented in a programmable logic device (PLD), the PLD comprising a plurality of dual-output lookup tables (LUTs) and additional programmable logic elements, the adder circuit comprising:
    a 3:2 (3 to 2) compressor circuit implemented in a first plurality of the dual-output LUTs; and
    a 2-input cascade adder comprising a first portion implemented in the first plurality of the dual-output LUTs and a second portion implemented in the additional programmable logic elements, the first and second portions being coupled together via output terminals of the first dual-output LUTs.

2. The adder circuit of claim 1, wherein the 3:2 compressor circuit provides first and second compressed busses from three input busses, and wherein the first portion of the 2-input cascade adder comprises an exclusive OR function of the first compressed bus and the second compressed bus.

3. The adder circuit of claim 1, wherein the 3:2 compressor circuit and the 2-input cascade adder each comprise an input terminal coupled to receive a subtract/add selection input signal.

4. The adder circuit of claim 1, wherein the adder circuit further comprises an M:3 compressor circuit coupled to provide three input busses to the 3:2 compressor circuit, where M is an integer greater than three.

5. The adder circuit of claim 4, wherein M is five, the M:3 compressor circuit comprises a 5:3 compressor, and the adder circuit comprises a 5-input adder.

6. The adder circuit of claim 4, wherein M is six, the M:3 compressor circuit comprises a 6:3 compressor, and the adder circuit comprises a 6-input adder.

7. The adder circuit of claim 4, wherein a second one of the three input busses is left-shifted with respect to a first one of the three input busses, and a third one of the three input busses is left-shifted with respect to the second one of the three input busses.

8. An adder circuit implemented in a programmable logic device (PLD), the PLD comprising a plurality of dual-output lookup tables (LUTs) and additional programmable logic elements, the adder circuit comprising a plurality of bit implementations, the nth bit implementation comprising:
 a dual-output LUT programmed to generate an nth bit of a first compressed bus from three input signals comprising nth bits of three input busses, and further programmed to generate an nth bit of a second compressed bus from the three input signals, the nth bit of the second compressed bus being provided to a first output terminal of the dual-output LUT; and
 a plurality of the additional programmable logic elements programmably coupled to implement a first portion of an nth bit of a 2-input cascade adder, the nth bit of the 2-input cascade adder combining the nth bit of the first compressed bus and the (n−1)st bit of the second compressed bus with a carry-in signal from an (n−1)st bit of the 2-input cascade adder to generate an nth bit of a sum output bus,
 wherein the dual-output LUT is further programmed to implement a second portion of the nth bit of the 2-input cascade adder, the dual-output LUT providing to the plurality of the additional programmable logic elements on a second output terminal a signal internal to the 2-input cascade adder.

9. The adder circuit of claim 8, wherein the second portion of the nth bit of the 2-input cascade adder comprises an exclusive OR function of the nth bit of the first compressed bus and the (n−1)st bit of the second compressed bus.

10. The adder circuit of claim 8, wherein the dual-output LUT is further programmed to implement a subtract/add selection feature wherein at least one of the three input signals is optionally inverted by the dual-output LUT.

11. The adder circuit of claim 8, wherein the adder circuit further comprises a compressor circuit coupled to provide the three input busses to the plurality of bit implementations, wherein the compressor circuit generates the three input busses from M original busses, where M is an integer greater than three.

12. The adder circuit of claim 11, wherein M is five, the compressor circuit comprises a 5:3 (5 to 3) compressor, and the adder circuit comprises a 5-input adder.

13. The adder circuit of claim 11, wherein M is six, the compressor circuit comprises a 6:3 (6 to 3) compressor, and the adder circuit comprises a 6-input adder.

14. The adder circuit of claim 11, wherein the compressor circuit comprises a plurality of compressors selected from a group consisting of: 6:3 compressors and 5:3 compressors.

15. A method of implementing an adder circuit in a programmable logic device (PLD), the PLD comprising a plurality of dual-output lookup tables (LUTs) and additional programmable logic elements, the method comprising:
 programming a first plurality of the dual-output LUTs to implement a 3:2 (3 to 2) compressor circuit generating first and second compressed busses from three input busses, and to provide the second compressed bus at first output terminals of the first plurality of the dual-output LUTs;
 programming a plurality of the additional programmable logic elements to implement a first portion of a 2-input cascade adder, the 2-input cascade adder combining the first compressed bus and the second compressed bus to generate a sum output bus; and
 further programming the first plurality of the dual-output LUTs to implement a second portion of the 2-input cascade adder, the first plurality of the dual-output LUTs providing to the plurality of the additional programmable logic elements via second output terminals of the first plurality of the dual-output LUTs a plurality of signals internal to the 2-input cascade adder.

16. The method of claim 15, where the programming the first plurality of the dual-output LUTs, the programming the plurality of the additional programmable logic elements, and the further programming the first plurality of the dual-output LUTs together comprise configuring the PLD with a single configuration bitstream.

17. The method of claim 15, wherein the further programming the first plurality of the dual-output LUTs to implement the second portion of the 2-input cascade adder comprises further programming the first plurality of the dual-output LUTs to implement an exclusive OR function of the first compressed bus and the second compressed bus.

18. The method of claim 15, further comprising:
 programming a second plurality of the dual-output LUTs to implement an M:3 compressor circuit providing the three input busses to the 3:2 compressor circuit, where M is an integer greater than three.

19. The method of claim 18, wherein the value of M is selected from a group consisting of: five and six.

20. The method of claim 18, further comprising:
 programming the PLD to couple the M:3 compressor circuit to the first plurality of the dual-output LUTs, wherein a second one of the three input busses is left-shifted with respect to a first one of the three input busses, and a third one of the three input busses is left-shifted with respect to the second one of the three input busses.

* * * * *